United States Patent [19]

Auffret

[11] Patent Number: 5,537,114

[45] Date of Patent: Jul. 16, 1996

[54] ANALOGUE-DIGITAL CONVERTER AND SLAVING LOOP USING SUCH A CONVERTER

[75] Inventor: Eric Auffret, Noyal/Vilaine, France

[73] Assignee: Thomson-CSF, Paris, France

[21] Appl. No.: 182,210

[22] PCT Filed: Nov. 11, 1993

[86] PCT No.: PCT/FR93/00443

§ 371 Date: Dec. 29, 1993

§ 102(e) Date: Dec. 29, 1993

[87] PCT Pub. No.: WO93/22840

PCT Pub. Date: Nov. 11, 1993

[30]      Foreign Application Priority Data

May 7, 1992 [FR] France .................. 92 05637

[51] Int. Cl.[6] ............................ H03M 1/36
[52] U.S. Cl. .......................... 341/159; 341/156
[58] Field of Search ...................... 341/156, 158, 341/159, 138

[56]            References Cited

U.S. PATENT DOCUMENTS

| | | | |
|---|---|---|---|
| Re. 32,313 | 12/1986 | Yamakido | 341/138 |
| 3,283,319 | 11/1966 | Kaneko | 341/159 |
| 4,217,574 | 8/1980 | Anderson | 341/138 |
| 4,571,574 | 2/1986 | Krynicki | 341/156 |
| 4,635,036 | 1/1987 | Yoshizawa | 341/159 |
| 4,982,191 | 1/1991 | Ohta | 341/118 |
| 4,990,913 | 2/1991 | Beauducel | 341/139 |
| 4,990,917 | 2/1991 | Kohdaka | 341/159 |
| 5,225,837 | 7/1993 | Hosotani et al. | 341/159 |
| 5,291,198 | 3/1994 | Dingwall et al. | 341/159 |
| 5,355,135 | 10/1994 | Redfern | 341/156 |

FOREIGN PATENT DOCUMENTS 0396746   11/1990   European Pat. Off. .
2082410   3/1982   United Kingdom .

*Primary Examiner*—Marc S. Hoff
*Attorney, Agent, or Firm*—Roland Plottel

[57]            ABSTRACT

An analogue-digital voltage converter comprising $2^n-1$ comparators making it possible to generate $2^n$ different voltage levels when the input voltage varies, and a binary coding circuit comprising means (2) for converting the $2^n$ voltage levels into $2^n$ binary codes each having n bits of resolution, characterized in that it comprises additional means (20) making it possible to code the voltage contained in at least one range of variation of the input voltage into an item of information having a number of bits of resolution greater than n. The converter applies more particularly to video signal processing devices (televisions, video recorders, cameras, etc.).

6 Claims, 6 Drawing Sheets

PRIORT ART

ANALOGUE-DIGITAL CONVERTER AND SLAVING LOOP USING SUCH A CONVERTER

The present invention relates to a analogue-digital converter.

It also relates to a slaving loop, usually called clamp or retroclamp, allowing the DC component of a video signal to be restored.

Analogue-digital converters are used in electronics when digital coding of the information takes place.

An analogue-digital converter (ADC) has the function of converting an analogue electrical quantity into digital data. This analogue electrical quantity may be either a voltage, or a current. As is known to the person skilled in the art, an n-bit analogue-digital converter delivers $2^n$ combinations each having n bits of resolution. The precision of such a converter is given by the changing of the least-significant bit, denoted LSB. According to the prior art, this precision is the same whatever the value of the input quantity. Depending on the desired applications, this may represent a drawback. It is so, for example, in slaving loops using analogue-digital converters so as to restore the DC component of a video signal.

The operation of restoring the DC component has the aim of fixing the DC reference voltage of the video signal at a precise value. According to this operation, the video signal of each line is sampled over its DC component or black level. A fraction of each sample is picked off and compared with a reference value so as to generate an error signal which is reinjected, possibly after amplification, into the video signal.

Several method are known to the person skilled in the art for carrying out this operation, and in particular a digital method, according to which the DC component is picked off after conversion of the said signal into digital code.

As has already been mentioned, the DC level picked off at the output of the analogue-digital converter is then defined with a precision of ±1 LSB. The DC component then exhibits an oscillation of ±1 quantification bit around the datum value, which has the consequence of preventing it stabilizing.

The invention does not exhibit this drawback.

The subject of the present invention is an analogue-digital voltage converter comprising $2^n-1$ comparators making it possible to generate $2^n$ different voltage levels when the input voltage varies, and a binary coding circuit comprising means for converting the $2^m$ voltage levels into $2^n$ binary codes each having n bits of resolution, characterized in that it comprises additional means making it possible to code the voltage contained in at least one range of variation of the input voltage into an item of information having a number of bits of resolution greater than n.

The subject of the present invention is also a loop for slaving the DC component of a video signal, characterized in that it contains an analogue-digital converter according to the invention.

One advantage of the invention is thus correctly to stabilize the level of the DC component.

Other characteristics and advantages of the invention will appear on reading a preferential embodiment, given with reference to the attached figures in which:

FIG. 1 describes an analogue-digital converter according to the prior art;

FIG. 2 describes a conversion curve of the converter described in FIG. 1;

FIG. 3 represents an example of an analogue-digital converter according to the invention;

FIG. 4 describes the conversion curve of the converter described in FIG. 3;

Throughout the figures, the same references designate the same elements.

According to the embodiments of the invention described, the input analogue electrical quantity is a voltage. It is obvious that the invention also relates to other types of converters, and especially converters for which the input quantity is a current.

Figure 1:
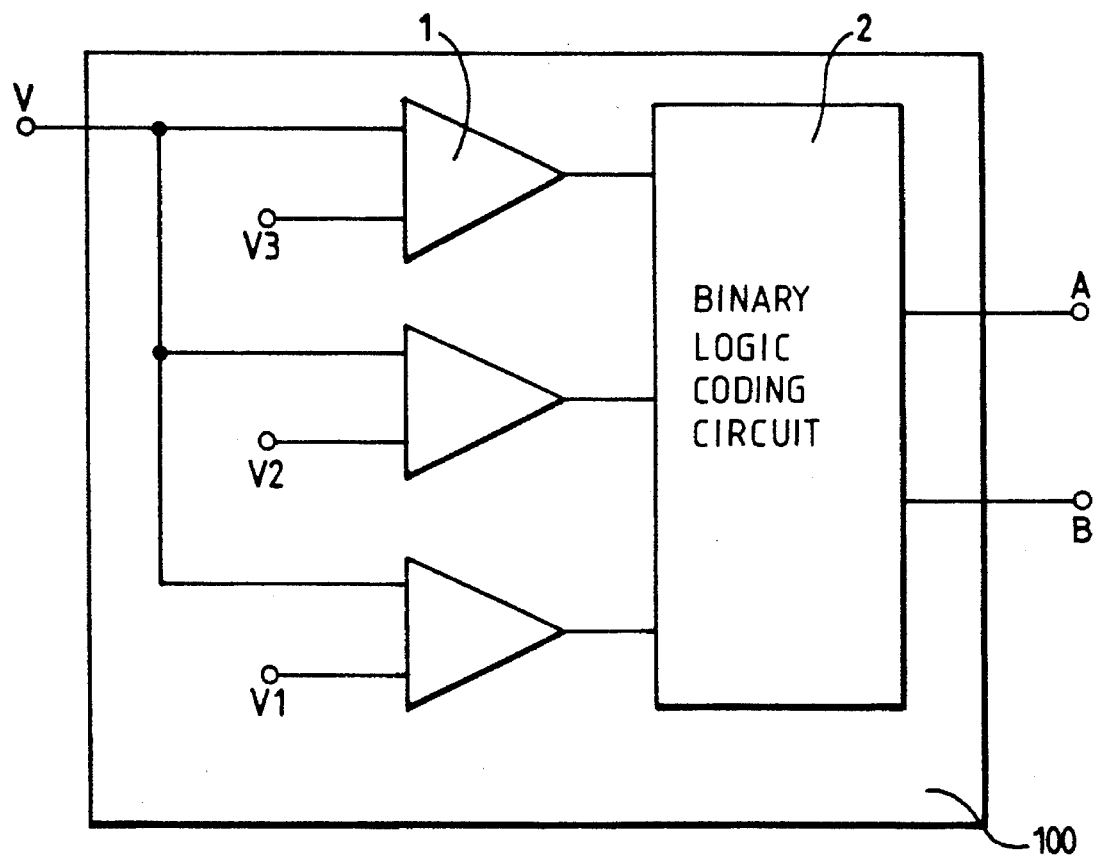

FIG. 1 describes an analogue-digital converter 100 according to the prior art. It takes the form of a converter known to the person skilled in the art under the name of flash converter. For reasons of simplicity, the device represented in FIG. 1 is a 2-bit converter delivering 4 combinations. As is known to the person skilled in the art, this converter contains 3 comparators 1. In a general way, an n-bit flash-type converter contains $2^n-1$ comparators.

The converter of FIG. 1 is such that the analogue input voltage V is compared to 3 reference voltages V1, V2, V3 with the aid of 3 comparators.

Depending on whether the voltage V is higher or lower than the reference voltages, the signal output by each comparator takes a first value or a second value between two possible values. The various signals output by the comparators are then sent to a logic circuit 2 making it possible, as is known to the person skilled in the art, to code into binary the information which it receives in the form of combinations of 2 bits. One bit is received at point A and the other at point B. There are 4 combinations=(0,0), (0,1), (1,0), (1,1).

Figure 2:
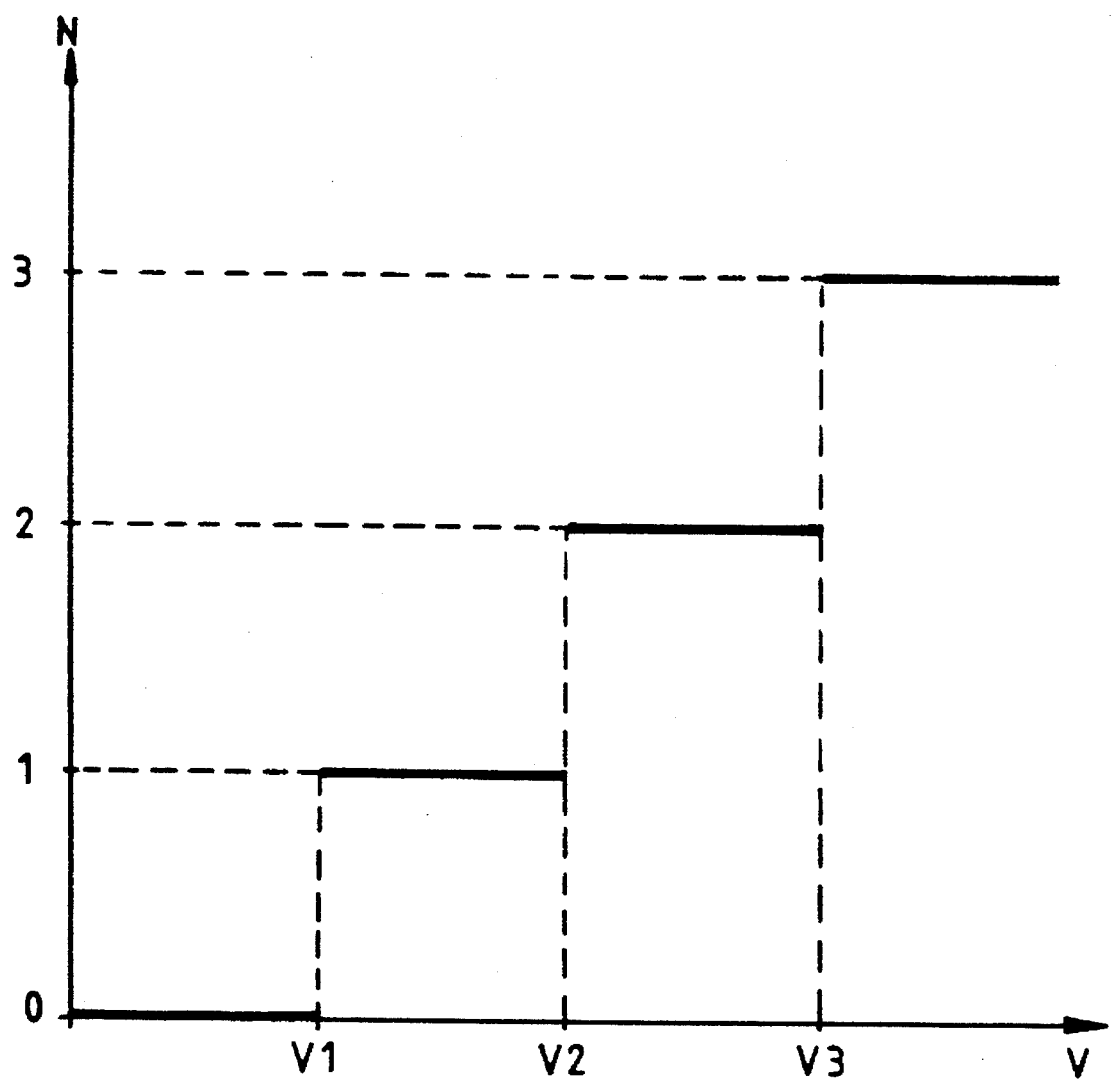

FIG. 2 describes the conversion curve of the converter described in FIG. 1.

This curve associates the input voltage V with the binary codes by ranks or levels N which allows them to be shown symbolically. It is thus possible to draw up the following table:

|    |   |          |       |            |
|----|---|----------|-------|------------|
|    |   | V < V1:  | N = 0 | code (0,0) |
| V1 | < | V < V2:  | N = 1 | code (0,1) |
| V2 | < | V < V3:  | N = 2 | code (1,0) |
|    |   | V > V3:  | N = 3 | code (1,1) |

Figure 3:
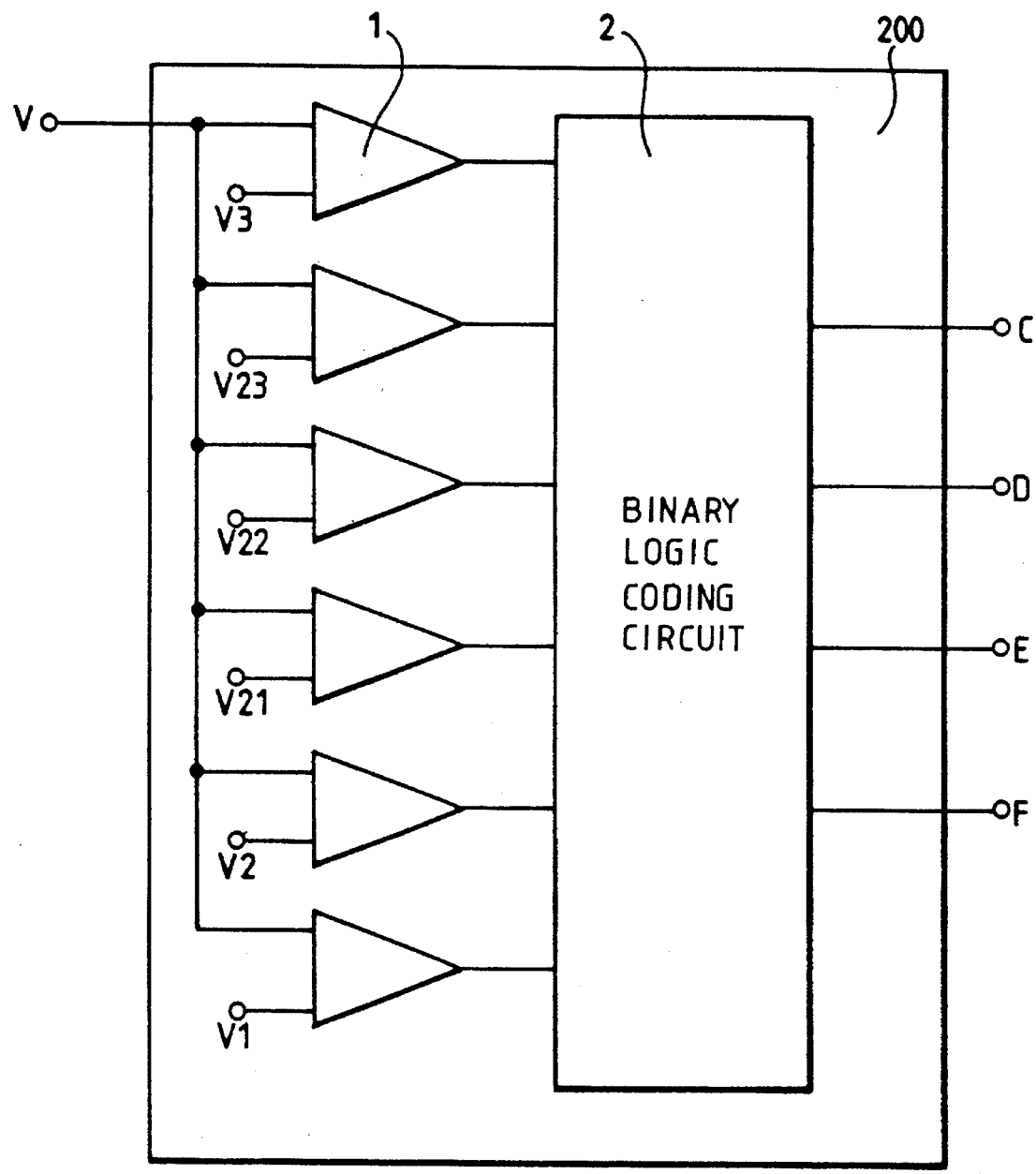

FIG. 3 represents an example of an analogue-digital converter according to one embodiment of the invention.

As with the converter 100 described in FIG. 1, the converter 200 described in FIG. 3 contains 3 comparators associated with the respective voltages V1, V2, V3.

According to the exemplary embodiment of the invention, 3 additional comparators allow the analogue voltage V to be compared with the respective reference voltages V21, V22, V23. These voltages lie, for example, in the interval situated between the voltages V2 and V3 in such a way that:

$$(V3-V23)=(V23-V22)=(V22-V21)=(V21-V2)$$

A binary coding logic circuit 2 receives the signals output by the various comparators. The binary codes generated by the circuit 2 are combinations of 4 bits received respectively at points C, D, E, F.

Figure 4:
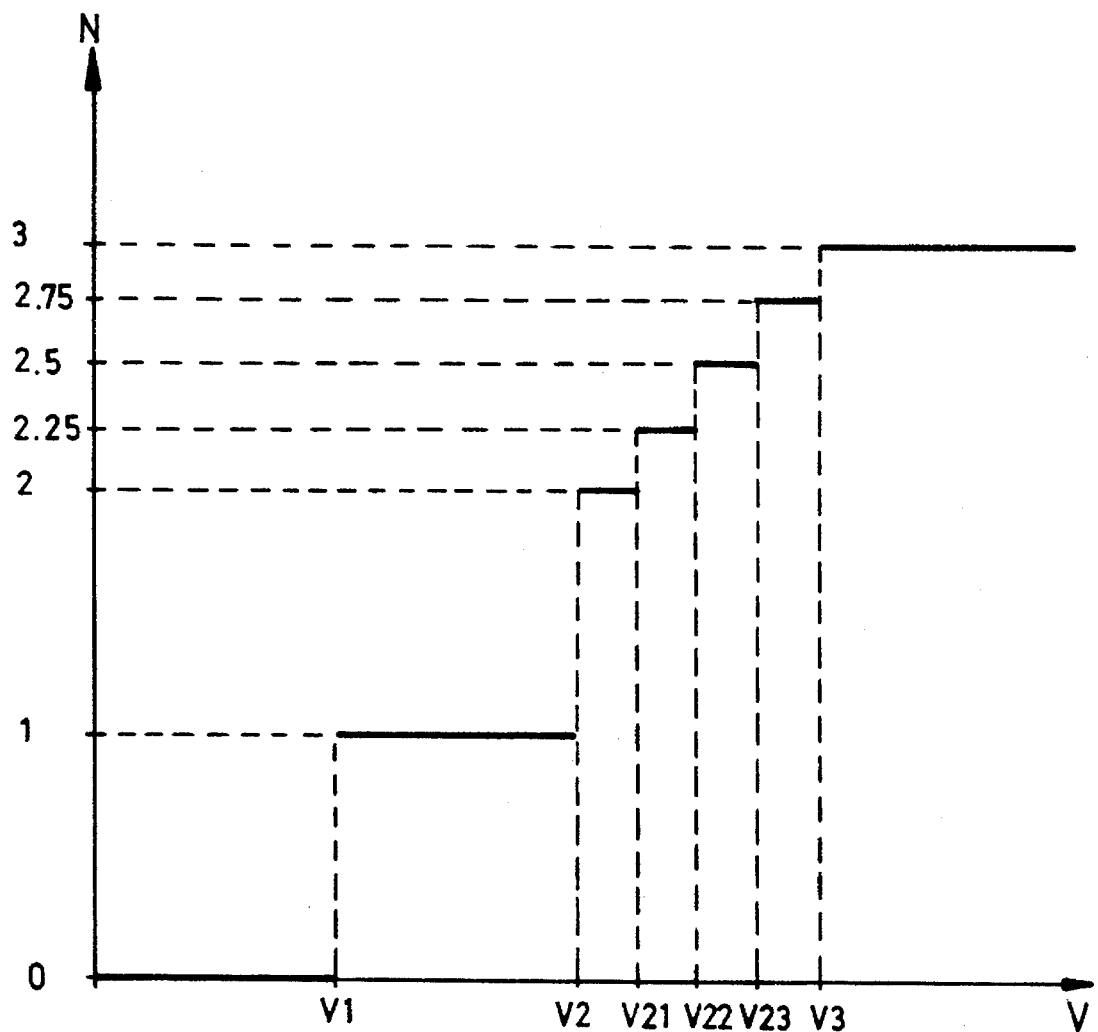

FIG. 4 describes the conversion curve of the converter of FIG. 3.

The fact of adding 3 comparators makes it possible to define 3 additional levels (2.25, 2.5, 2.75) situated between the levels 2 and 3.

According to the invention, the precision of the converter is multiplied by 4 when the analogue voltage V varies between V2 and V3 since the converter delivers two supplementary bits of resolution.

The following table can then be drawn up:

| Variation in V | Level | Bit received at C | Bit received at D | Bit received at E | Bit received at F |
|---|---|---|---|---|---|
| V < V1 | 0 | 0 | 0 | 0 | 0 |
| V1 < V < V2 | 1 | 0 | 1 | 0 | 0 |
| V2 < V < V21 | 2 | 1 | 0 | 0 | 0 |
| V21 < V < V22 | 2.25 | 1 | 0 | 0 | 1 |
| V22 < V < V23 | 2.5 | 1 | 0 | 1 | 0 |
| V23 < V < V3 | 2.75 | 1 | 0 | 1 | 1 |
| V > V3 | 3 | 1 | 1 | 0 | 0 |

The binary codes received at points C and D of the converter 200 are identical to the binary codes received at points A and B respectively of the converter 100. The binary codes received at points E and F are associated with the information delivered by the 3 supplementary comparators. These comparators make it possible to generate 4 combinations each of 2 bits when the voltage V lies between the values V2 and V3.

When the voltage V is lower than V2 or higher than V3, the logic circuit 2 forces the bits to zero by any means known to the person skilled in the art, which it is therefore not necessary to restate in the present application.

Figure 5:
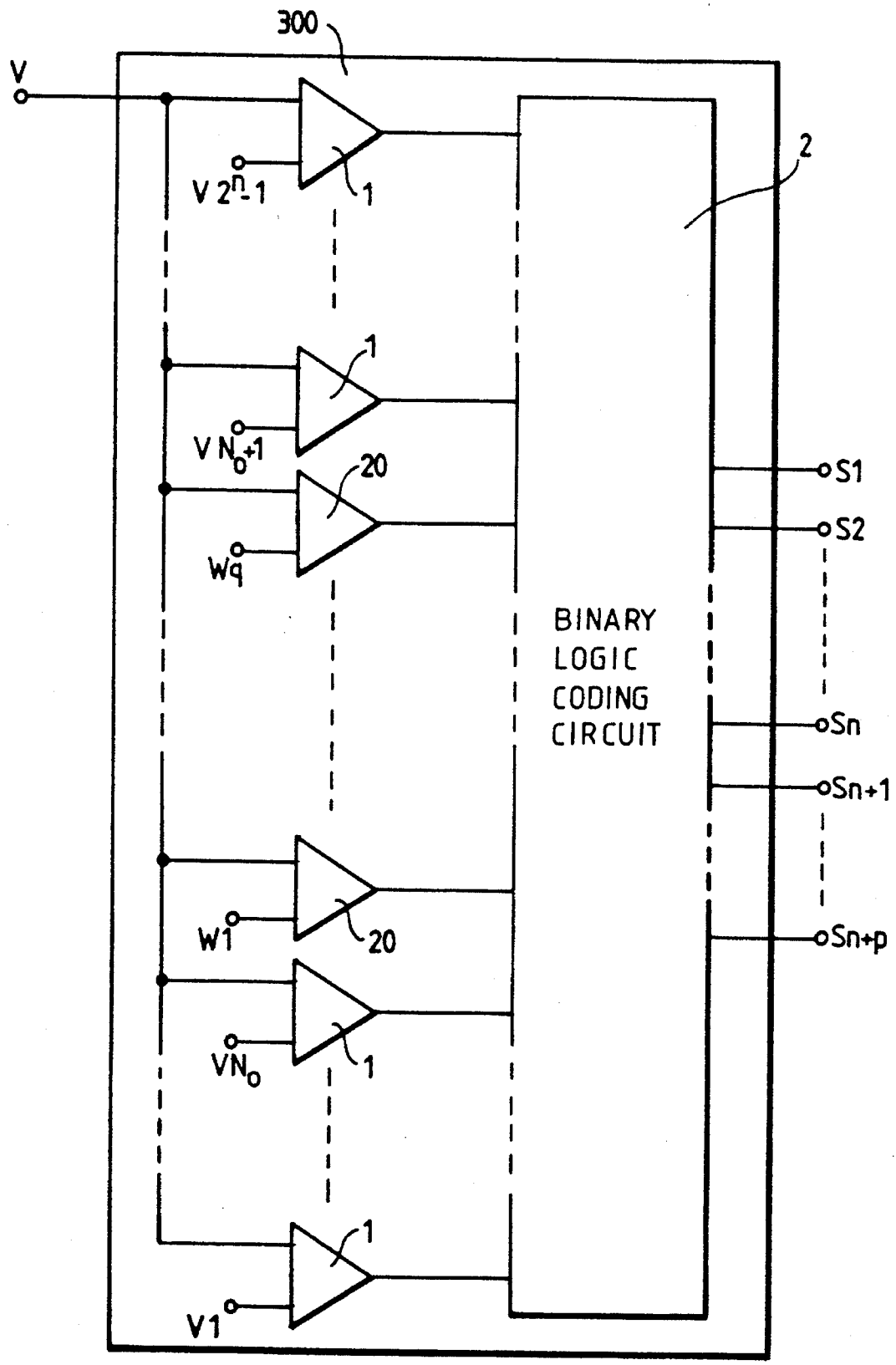
FIG. 5 represents an analogue-digital converter according to the preferential embodiment of the invention.

FIG. 5 represents an analogue-digital converter according to the preferential embodiment of the invention. It takes the form of a generalization of the analogue-digital converter described in FIG. 3.

The analogue-digital converter 300 comprises a first set of $2^n-1$ comparators 1. Each comparator is associated with a voltage $V_i$ (i=1, 2, ---, $2^n-1$). For preference, the voltages $V_i$ are spaced in such a way that:

$$V_{j+1}-V_j=V_j-V_{j-1} \quad (j=1, 2, ---, 2^n-1)$$

The $2^n-1$ comparators define $2^n$ different voltage levels (N=1, 2, ---, 2n).

According to the invention, the converter 300 comprises q supplementary comparators 20. Each of these comparators is associated with a voltage $W_k$ (k=1, 2, ---, q) lying between two successive voltages $VN_o$ and $V(N_o+1)$, taken from among the $2^n-1$ voltages mentioned above.

For preference, the voltages $W_k$ are chosen in such a way that:

$$V(N_o+1)-W_q=(W_q-W(q-1))=---=(W2-W1)=(W1-VN_o).$$

The q supplementary comparators make it possible to define NI=q+1 intermediate levels situated between the level $N_o$ and the level $N_o+1$.

According to the first embodiment of the invention, the binary coding circuit 2 converts, on the one hand, the information constituted by the $2^n$ levels into n-bit codes and, on the other hand, the information constituted by the NI intermediate levels into p-bit codes. As is known to the person skilled in the art, the number NI must be a whole number equal to a power of 2. Thus q=2P−1.

The n-bit binary codes are received on the outputs S1, S2 --- Sn, and the p-bit binary codes on the outputs $S_{n+1}$, ---, $S_{n+p}$.

In the same way as was mentioned above, the binary coding circuit comprises means making it possible to force to zero the combinations of p bits for all the integer levels from 1 to $2^n$, that is to say other than in the area of interest.

According to the preferential embodiment of the invention n=8 and p=2.

According to the preferential embodiment of the invention, the analogue-digital converter which has just been described comprises a single subassembly of q supplementary comparators situated between two successive integer levels. It is obvious that the invention also relates to analogue-digital converters containing several subassemblies of supplementary comparators such as that described above.

According to the invention, the supplementary levels generated by a subassembly of q comparators may be situated between two successive integer levels, as described above, or equally on either side of one or of several integer levels.

Figure 6:
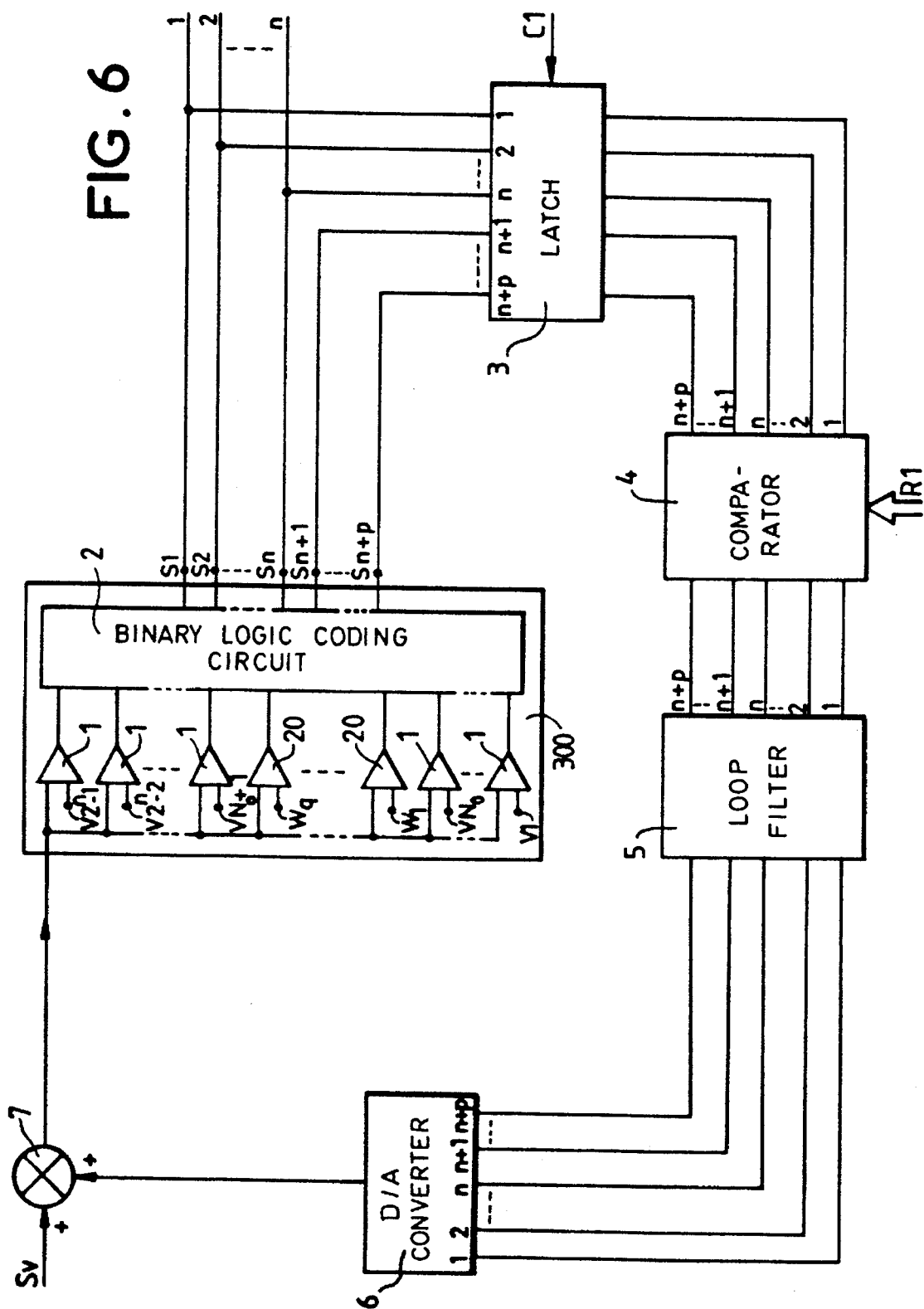
FIG. 6 represents an application of the converter described in FIG. 5.

FIG. 6 represents an application of the converter described in FIG. 5.

The analogue-digital converter 300 is situated in a loop for slaving the DC component of a video signal Sv.

The level $N_o$ associated with the voltage $VN_o$ then represents the DC component of the video signal. According to the preferential embodiment, $N_o=16$. This is the level currently recommended by the international standard for sampling the luminance signal (standard 4:2:2). However, a level which is different from the level 16 could equally well be chosen, for example the level 128 which corresponds to the chrominance signal.

It was mentioned above that, according to the preferential embodiment, n=8 and p=2, the intermediate levels are then 3 in number (16.25, 16.50, 16.75).

The combinations of the p supplementary bits are significant only for the non-integer intermediate levels (for example 16.25, 16.50 and 16.75 according to the preferential embodiment of the invention) since, as was mentioned above, the binary coding circuit 2 comprises means making it possible to force to zero the combinations of p bits for all the integer levels from 1 to $2^n$, that is to say other than in the area where the intermediate levels are of interest.

According to the invention, the device of FIG. 6 makes it possible to slave the DC component of the video signal so as to suppress the oscillation of ±1 quantification bit which is present in the devices of the prior art. To this end, the slaving loop uses the code constituted at the output of the analogue-digital converter 300 by the m=n+p bits. This code is sent to a latch 3. A control signal C1 allows the latch 3 to be sampled at the rate of appearance of the black level of the input video signal Sv. The codes used around the DC component are then compared with the aid of the comparator 4 to a reference code R1, the combination of which is identical to one of those in which the p-bit codes are significant.

The error signal output by the comparator 4 is then transferred with the aid of the loop filter 5, for example a digital integrator, to a digital analogue converter 6 which converts the digital error into analogue error voltage applied to the algebraic adder 7 so as to readjust the DC level of the voltage.

According to the preferential embodiment, the reference code R1 is identical to that which corresponds to the level 16.50. As was mentioned above, the precision obtained in steady-state regime is given by the switching of the least-significant bit. According to the preferential embodiment, the precision obtained is thus equal to ±0.25 LSB around the reference datum value R1, in which LSB designates the least-significant bit of the n-bit codes. In steady-state regime, the DC level of the video component is thus fixed at level 16, without spurious oscillation. In general, the precision of the analogue-digital converter is equal to ±1 LSB/$2^P$.

It may noted that the use of a conventional m-bit analogue-digital converter, delivering $2^m$ combinations, makes it possible to apply the principle described in this document. That, however, exhibits a major drawback in terms of cost, since the surface area of the silicon which makes it possible to produce the component is very significantly increased, as is its consumption. Moreover, it is not necessarily a requirement for the precision to be thus extended over the whole of the converter.

I claim:

1. An analog to digital voltage converter having ($2^n$-1) comparators, n being a positive integer, to generate a first set of $2^n$ different voltage levels, among which are a first, a last, and 2n-2 intermediary voltage levels, the levels having between them intermediary gaps; a binary coding circuit having means for converting the $2^n$ voltage levels into a first set of $2^n$ binary codes each having a set of n bits of resolution; and means to code at least one of the intermediary voltage gaps to output an item of information having a number of bits of resolution greater than n.

2. The digital converter according to claim 1 wherein said means to code comprises at least one set of ($2^P$-1) comparators, p being a positive integer, to generate a second set of $2^P$ voltage levels, said $2^P$ levels being between two consecutive levels of the first set of levels, and means for converting said second set of $2^P$ voltage levels into a second set of $2^P$ binary codes each of p bits the input voltage being then converted into a code of at least n+p bits.

3. The analog to digital converter according to claim 2 wherein the binary coding circuit comprises means for forcing to zero said second set of p bits.

4. A loop for slaving a direct current component of a video signal to a reference level having an analog to digital voltage converter having ($2^n$-1) comparators n being a positive integer to generate a first set of $2^n$ different voltage levels, which include a first, a last, and $2^n$-2 intermediary voltage levels, the levels having between them intermediary voltage gaps, each gap having two limit levels, a first and a second, and a binary coding circuit having means for converting the $2^n$ voltage levels into a first set of n bits of resolution, the converter comprises means to code at least one of the intermediary voltage gaps to output an item of information having a number of bits of resolution greater than n, and wherein one of the limit levels of one of said at least one intermediary gap is the reference level.

5. The slaving loop according to claim 4 wherein said additional means to code the converter comprise at least one set of ($2^P$-1) comparators, p being a positive integer, to generate a second set of $2^P$ voltage levels said $2^P$ voltage levels being between two consecutive levels of the first set of levels, and means for converting said second set of $2^P$ voltage levels into a second set of $2^P$ binary codes, each of p bits, the input being then converted into a code of at least (n+p) bits.

6. The slaving loop according to one of claims 4 or 5, wherein said loop comprises a latch linked to the analog-digital converter to sample the signal output from the converter at the rate of appearance of the DC component under the influence of an external command (C1), a comparator receiving information output from said latch and comparing said information to a reference code (R1) the combination of which is identical to one of those of which the p-bit codes are non-zero, a loop filter receiving signal output from the comparator, a digital-analog converter which converts the signal output by the loop filter into an analog error voltage, and an algebraic adder receiving the analog error voltage to readjust the level of the DC component.

* * * * *